United States Patent
Marks et al.

(10) Patent No.: US 10,115,917 B2
(45) Date of Patent: Oct. 30, 2018

(54) DOPANT-FREE POLYMERIC HOLE-TRANSPORTING MATERIALS FOR PEROVSKITE SOLAR CELL

(71) Applicant: Northwestern University, Evanston, IL (US)

(72) Inventors: Tobin J. Marks, Evanston, IL (US); Robert P. H. Chang, Glenview, IL (US); Teck Lip Dexter Tam, Evanston, IL (US); Hsueh-Chung Liao, Chicago, IL (US); Antonio Facchetti, Chicago, IL (US)

(73) Assignee: Northwestern University, Evanston, IL (US)

( * ) Notice: Subject to any disclaimer, the term of this patent is extended or adjusted under 35 U.S.C. 154(b) by 135 days.

(21) Appl. No.: 15/157,778

(22) Filed: May 18, 2016

(65) Prior Publication Data

US 2016/0343965 A1  Nov. 24, 2016

Related U.S. Application Data

(60) Provisional application No. 62/163,712, filed on May 19, 2015.

(51) Int. Cl.
  *H01L 51/42* (2006.01)
  *H01L 51/44* (2006.01)
  (Continued)

(52) U.S. Cl.
  CPC ........ *H01L 51/4213* (2013.01); *C08G 61/123* (2013.01); *C08G 61/126* (2013.01);
  (Continued)

(58) Field of Classification Search
  CPC ............. H01L 51/4213; H01L 51/0043; H01L 51/0036; H01L 51/0077; H01L 51/442
  See application file for complete search history.

(56) References Cited

U.S. PATENT DOCUMENTS

| | | | |
|---|---|---|---|
| 5,578,405 A | * | 11/1996 | Ikegami ............... G03G 5/0605 430/56 |
| 2004/0119049 A1 | * | 6/2004 | Heeney ................ C08G 61/126 252/299.3 |

(Continued)

FOREIGN PATENT DOCUMENTS

| JP | 2001156307 A | 6/2001 |
|---|---|---|
| WO | 2014109604 A1 | 7/2014 |

OTHER PUBLICATIONS

Liu, J. et al., "A dopant-free hole-transporting material for efficient and stable perovskite solar cells.", Energy & Environmental Science, 2014, vol. 7, No. 9, 2963-2967.

(Continued)

*Primary Examiner* — Golam Mowla
(74) *Attorney, Agent, or Firm* — Bell & Manning, LLC

(57) ABSTRACT

The present teachings relate to hybrid organic-inorganic perovskite solar cells including a hole-transport layer in contact with the perovskite light-absorbing layer, where the hole-transport layer (HTL) is a pristine (undoped) polymer. More specifically, the HTL comprises a copolymer including a benzo[1,2-d;4,5-d']bistriazole-containing repeating unit and a benzo[1,2-b:4,5-b']dithiophene-containing repeating unit.

18 Claims, 8 Drawing Sheets

(51) Int. Cl.
*H01L 51/00* (2006.01)
*C08G 61/12* (2006.01)

(52) U.S. Cl.
CPC ...... *H01L 51/0036* (2013.01); *H01L 51/0043* (2013.01); *H01L 51/0077* (2013.01); *H01L 51/442* (2013.01); *C08G 2261/124* (2013.01); *C08G 2261/148* (2013.01); *C08G 2261/149* (2013.01); *C08G 2261/1412* (2013.01); *C08G 2261/3223* (2013.01); *C08G 2261/3241* (2013.01); *C08G 2261/3243* (2013.01); *C08G 2261/364* (2013.01); *C08G 2261/41* (2013.01); *C08G 2261/414* (2013.01); *C08G 2261/512* (2013.01); *C08G 2261/91* (2013.01); *C08G 2261/92* (2013.01)

(56) References Cited

U.S. PATENT DOCUMENTS

| | | | | |
|---|---|---|---|---|
| 2004/0176560 A1* | 9/2004 | Heeney | ............ | C08G 61/02 528/4 |
| 2004/0230021 A1* | 11/2004 | Giles | ............ | C08G 61/126 528/4 |
| 2005/0090640 A1* | 4/2005 | Heeney | ............ | C07D 495/04 528/377 |
| 2005/0175859 A1* | 8/2005 | Lin | ............ | C07C 211/54 428/690 |
| 2006/0249712 A1* | 11/2006 | Heeney | ............ | H05B 33/14 252/500 |
| 2008/0275212 A1* | 11/2008 | Heeney | ............ | C08G 61/123 528/378 |
| 2013/0092912 A1* | 4/2013 | You | ............ | H01L 51/0036 257/40 |
| 2013/0333758 A1* | 12/2013 | Okabe | ............ | H01L 51/0036 136/263 |
| 2014/0042371 A1* | 2/2014 | Blouin | ............ | B82Y 10/00 252/500 |
| 2014/0061538 A1* | 3/2014 | Blouin | ............ | C07D 495/04 252/301.35 |
| 2014/0084220 A1* | 3/2014 | Inagaki | ............ | H01L 51/0036 252/511 |
| 2014/0124710 A1* | 5/2014 | Izawa | ............ | H01L 51/0036 252/511 |

OTHER PUBLICATIONS

Song, C. K. et al., "Conjugated Polymer Energy Level Shifts in Lithium-Ion Battery Electrolytes.", ACS applied materials & interfaces, 2014, vol. 6, No. 21, 19347-19354.

Liu, Y. et al., "A dopant-free organic hole transport material for efficient planar heterojunction perovskite solar cells", Journal of Materials Chemistry A, 2015, vol. 3, 11940-11947.

International Search Report and Written Opinion for PCT/US2016/033012 dated Oct. 21, 2016, 10 pages.

* cited by examiner

DOPANT-FREE POLYMERIC HOLE-TRANSPORTING MATERIALS FOR PEROVSKITE SOLAR CELL

This application claims priority to and the benefit of application Ser. No. 62/163,712 filed May 19, 2015, the entirety of which is incorporated herein by reference.

This invention was made with government support under DE-SC0001059 awarded by the Department of Energy. The government has certain rights in the invention.

BACKGROUND

Various optoelectronic devices, such as photovoltaic cells and light-emitting devices, require the use of hole/electron-transport layers (HTL/ETL) for proper device performance. In these devices, most of the hole-transporting materials (HTMs) must be chemically p-doped to enhance transport efficiency before device incorporation. Examples of commonly used HTMs include chemically-doped poly(3,4-ethylenedioxythiophene) polystyrene sulfonate (PEDOT:PSS), polyaniline (PANT), polypyrrole (PPy). However, these conductive HTMs are mainly only soluble in water and are often corrosive in nature, thus preventing their use in stable and moisture-sensitive devices.

Perovskite solar cells have experienced tremendous growth over recent years due to the low production costs of perovskite materials and power conversion efficiencies (PCE) approaching that of crystalline Si solar cells. The light-harvesting active layer in these solar cells is composed of a perovskite structured compound; most commonly, a hybrid organic-inorganic lead or tin halide $ABX_3$, where A is an organic cation (typically $CH_3NH_3^+$ or $HN=CHNH_3^+$), B is $Sn^{2+}$ or $Pb^{2+}$, and X is a halide anion that bonds to both. To date, methylammonium lead trihalide ($CH_3NH_3PbX_3$, where X is a halogen ion such as $I^-$, $Br^-$, or $Cl^-$), with an optical bandgap between 2.3 eV and 1.6 eV depending on halide content, represents the most efficient perovskite material. For example, $CH_3NH_3PbI_3$ and $CH_3NH_3PbI_{3-x}Cl_x$ have optical absorption coefficients of $\sim 10^5$ cm$^{-1}$ and yield PCEs over 15%.

Three major device architectures have been investigated with perovskite solar cells: (i) meso-structured perovskite solar cells (MSSC), (ii) positive planar heterojunction perovskite solar cells (positive PHJPSC), and (iii) inverted PHJPSC. In MSSC devices, the perovskite absorber is infiltrated within a mesoporous metal oxide scaffold (which can be an electron-transporting oxide such as $TiO_2$, ZnO, or an insulating layer such as $Al_2O_3$, $ZrO_2$) formed on top of a compact $TiO_2$ blocking layer, which itself is deposited on a transparent conducting oxide substrate that functions as the anode. An HTM is often deposited over the perovskite to improve conductivity. A high work-function metal electrode is used as the cathode. PHJPSC devices have simpler device fabrication process and less production variation because no porous metal-oxide structure is needed and in turn, no pore-filling deviation with the perovskite. In these planar devices, the perovskite functions as the ambipolar layer in a p-i-n junction, where the intrinsic (i) layer is the perovskite absorber. In the positive PHJPSC configuration, an n-type conductor (e.g., $TiO_2$, ZnO) is coated on a transparent conductive oxide substrate as the ETL, followed by deposition of the perovskite layer (PL), a p-type conductor as the HTL, and a high work-function metal as the cathode. In the inverted PHJPSC configuration, the sequence of the ETL, PL, and HTL is reversed; that is, a p-type conductor was coated on the transparent electrode, and an n-type conductor was deposited on the perovskite layer instead.

Despite rapid advances in the device architecture and fabrication technique of perovskite solar cells, the development of HTMs for perovskite solar cells has been limited. Specifically, 2,2',7,7'-tetrakis(N,N-di-p-methoxyphenylamine)-9,9'-spirobifluorene (spiro-OMeTAD or spiro), which has a twisted spirobifluorene core and a general bulky, three-dimensional structure, remains the HTM of choice and has reported the best device performance regardless of device architectures. However, the prospect of commercializing perovskite solar cells with spiro-OMeTAD as the HTM is poor for the following reasons. First, the current synthetic route to spiro-OMeTAD is tedious and expensive. Second, to improve its low intrinsic conductivity and mobility, spiro-OMeTAD needs to be oxidized, which is commonly achieved by introducing chemical dopants or additives (examples of which include Li-bis(trifluoromethanesulfonyl) imide (Li-TFSI) and tert-butylpyridine (tBP)) and exposure to air. Many of these dopants and additives are deliquescent, which is detrimental to device stability considering the moisture-sensitive perovskite absorber. Also, precise control over the oxidation process can be difficult, which greatly compromises device reproducibility. Further, the oxidation-promoted efficiencies often are short-lived, which casts doubts on their practical applications outside of the laboratory.

Accordingly, there is a need in the art for alternative hole-transporting materials for use in perovskite solar cells that can be produced via simpler synthetic routes and lower production cost, have compatible HOMO energy level relative to perovskites and high charge-carrier mobility, and most importantly, can provide high power conversion efficiencies without the use of chemical dopants.

SUMMARY

In light of the foregoing, the present teachings provide novel hole-transporting materials including a low-bandgap polymer that can provide high power conversion efficiencies without the use of dopants. The low-bandgap polymer generally can be described as a copolymer of a first repeating unit comprising a benzo[1,2-d;4,5-d']bistriazole (BBT) moiety and a second repeating unit comprising a benzo[1,2-b: 4,5-b']dithiophene (BDT) moiety.

The present teachings also relate to perovskite photovoltaic devices including such hole-transporting materials and methods for fabricating such devices.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
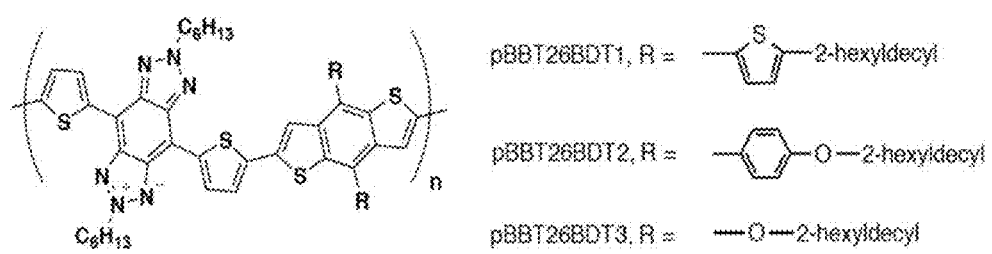
FIG. 1 illustrates the chemical structure of three exemplary polymers according to the present teachings.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$FF(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "polymeric compound" (or "polymer") refers to a molecule including a plurality of one or more repeating units connected by covalent chemical bonds. A polymeric compound can be represented by the general formula:

$$*-(M)-*$$

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

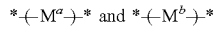

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

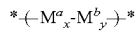

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S— alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is as defined herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

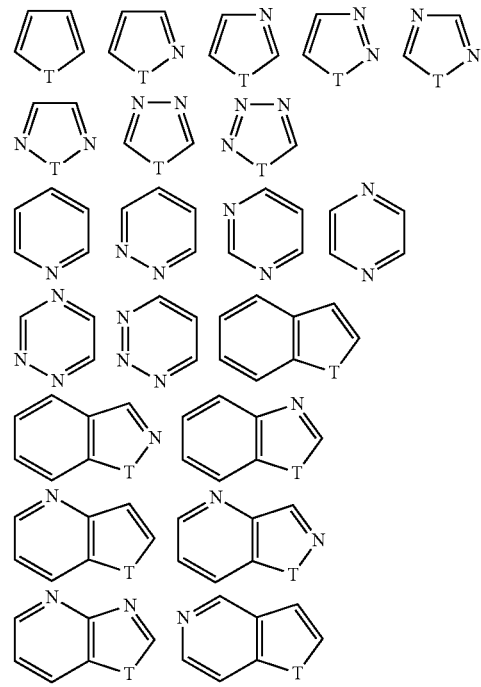

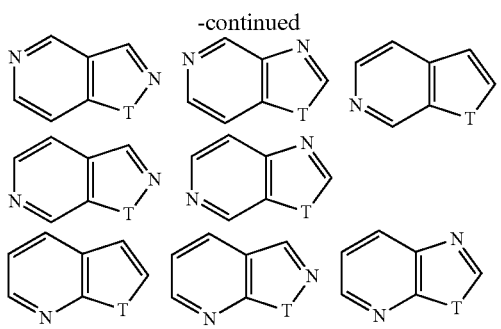

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group), a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "C$_{1-6}$ alkyl" is specifically intended to individually disclose C$_1$, C$_2$, C$_3$, C$_4$, C$_5$, C$_6$, C$_1$-C$_6$, C$_1$-C$_5$, C$_1$-C$_4$, C$_1$-C$_3$, C$_1$-C$_2$, C$_2$-C$_6$, C$_2$-C$_5$, C$_2$-C$_4$, C$_2$-C$_3$, C$_3$-C$_6$, C$_3$-C$_5$, C$_3$-C$_4$, C$_4$-C$_6$, C$_4$-C$_5$, and C$_5$-C$_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

The present teachings provide novel polymers based on a first repeating unit comprising a benzo[1,2-d;4,5-d']bistriazole (BBT) moiety and a second repeating unit comprising a benzo[1,2-b:4,5-b']dithiophene (BDT) moiety. The benzo[1,2-d;4,5-d']bistriazole (BBT) moiety can be selected from one of several isomeric forms including:

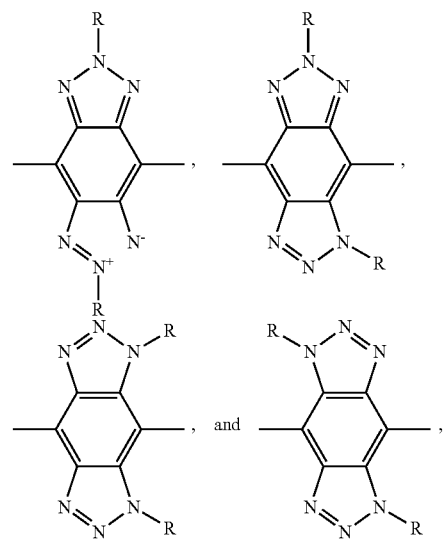

where R can be H or a substituent. The benzo[1,2-b:4,5-b']dithiophene (BDT) moiety can be represented by:

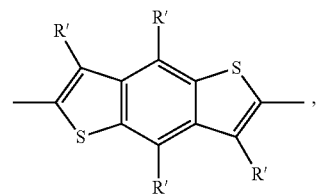

where each R' can be H or a substituent. Polymers according to the present teachings can have a molecular weight between about 10,000 g/mol and about 150,000 g/mol, and can have a bandgap between about 1.0 and about 2.0.

In various embodiments, the present polymers can include a repeating unit represented by formula (I):

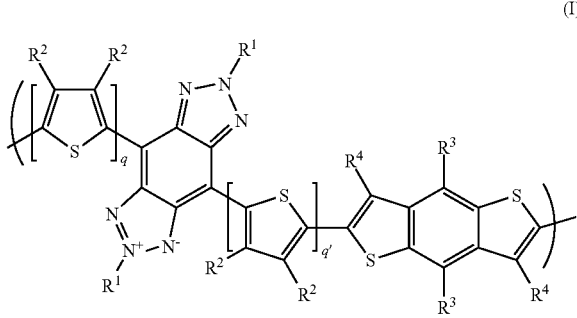

wherein:
R$^1$, at each occurrence, independently is a solubilizing group;

$R^2$, at each occurrence, independently is selected from the group consisting of H, F, Cl, CN, and a $C_{1-40}$ alkyl or haloalkyl group;

$R^3$ and $R^4$, at each occurrence, independently are selected from the group consisting of H, F, Cl, and -L-(Ar)$_m$-L'-R$^5$; wherein L and L', independently are selected from the group consisting of —O—, —S—, —Se—, —C(O)—, —OC(O)—, —C(O)O—, a divalent $C_{1-40}$ alkyl or haloalkyl group, and a covalent bond; $R^5$ is a solubilizing group; Ar, at each occurrence, independently is a $C_{6-14}$ aryl group or a 5-14 membered heteroaryl group, each of which optionally is substituted with 1-4 -L'-R$^5$ groups; and m is 0, 1, 2, 3 or 4; and q and q' independently are 0, 1, 2, 3 or 4.

Substitution of alkyl chains (or similar groups such as alkenyl groups, haloalkyl groups, arylalkyl groups, heteroarylalkyl groups and so forth) on the benzo[1,2-d;4,5-d']bistriazole (BBT) moiety and/or the benzo[1,2-b:4,5-b']dithiophene (BDT) moiety can improve the solubility of the polymer in various organic solvents, hence improving the processability of the polymer into thin film materials. Accordingly, $R^1$, $R^3$ and/or $R^4$ can be selected from various organic functional groups comprising one or more alkyl, alkenyl, and/or haloalkyl groups, preferably alkyl, alkenyl, and haloalkyl groups having at least 3 carbon atoms.

In some embodiments, $R^1$ can be a linear or branched $C_{3-40}$ alkyl group, while $R^2$, at each occurrence, independently can be H or a linear or branched $C_{3-40}$ alkyl group. In some embodiments, $R^3$ can be -L-(Ar)m-L'-R$^5$ while $R^4$ can be H, F, or Cl.

In certain embodiments, the present polymer can include a repeating unit represented by formula (II):

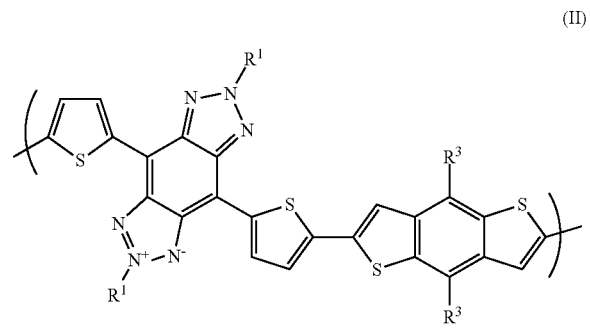

(II)

wherein $R^1$ is a $C_{3-40}$ alkyl group, and $R^3$ is -L-(Ar)$_m$-L'-R$^5$, where L, L', Ar, $R^5$, and m are as defined herein. For example, in one embodiment, $R^3$ can be an —O—C$_{3-40}$ alkyl group. In another embodiment, $R^3$ can be a $C_{3-40}$ alkyl group. In yet another embodiment, $R^3$ can be —(Ar)$_m$-L'-R$^5$, where Ar can be a thienyl or phenyl group, L' can be O or a covalent bond, and $R^5$ can be a $C_{3-40}$ alkyl group. To further illustrate, in one embodiment, $R^3$ can be a thienyl group substituted with a $C_{3-40}$ alkyl group.

Polymers of the present teachings and monomers leading to the present polymers can be prepared according to procedures analogous to those described in the Examples. In particular, Stille coupling or Suzuki coupling reactions can be used to prepare co-polymeric compounds according to the present teachings with high molecular weights and in high yields and purity, as confirmed by $^1$H NMR spectra, elemental analysis, and/or GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

The present polymers can be ambient-stable, which allows the present polymers to be used in devices intended to be operated in air. As used herein, a compound can be considered "ambient stable" or "stable at ambient conditions" when a device (e.g., an optoelectronic device) incorporating the compound as one of its electronic, optical, or optoelectronic components exhibits a device performance parameter (e.g., carrier mobility, optical absorption) that remains stable (e.g., exhibiting a variance no more than 20%, preferably no more than 10%, from its initial value) after exposure to ambient conditions (including, air, humidity and temperature) over a 3 day, 5 day, or 10-day period.

The present polymers also can have good solubility in various common organic solvents. As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methylpyrrolidone. In particular, the present polymers can have good solubility and processability in non-polar solvents such as chlorobenzene and dichlorobenzene.

The present polymers can be fabricated into various articles of manufacture using solution processing techniques in addition to other more expensive processes such as vapor deposition. Various solution processing techniques have been used with organic electronics. Common solution processing techniques include, for example, spin coating, slot coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present polymers can possess certain processing advantages such as solution-processability and/or good stability (e.g., air stability) in ambient conditions. The polymers of the present teachings can be used to prepare p-type (donor or hole-transporting) semiconductor materials, which in turn can be used alone or together with other p-type, n-type (acceptor or electron-transporting), and/or ambipolar semiconductor materials to fabricate various organic or hybrid optoelectronic articles, structures and devices.

Various articles of manufacture including optical devices, optoelectronic devices, and electronic devices such as thin film semiconductors, organic and hybrid photovoltaic devices, photodetectors, thin film transistors such as organic field-effect transistors (OFETs), and organic light-emitting devices such as organic light-emitting diodes (OLEDs) and organic light emitting transistors (OLETs), that make use of the polymers disclosed herein are within the scope of the present teachings as are methods of making the same. The present polymers can offer processing and operation advantages in the fabrication and/or the use of these devices.

For example, articles of manufacture such as the various devices described herein can be an optical or optoelectronic device including a first electrode, a second electrode, and a semiconducting component disposed between the first electrode and the second electrode, where the semiconducting component includes a polymer of the present teachings.

In one embodiment, the present teachings relate to an organic field effect transistor (OFET) that incorporates a semiconductor material comprising a polymer according to the present teachings. The OFET can include a substrate, a gate electrode, a gate dielectric, source and drain electrodes, and a thin film semiconductor comprising the present polymer, where the thin film semiconductor is in contact with the source and drain electrodes on one side, and the gate dielectric on another side. The OFET can have a device architecture selected from (a) bottom-gate top-contact structure, (b) bottom-gate bottom-contact structure, (c) top-gate bottom-contact structure, and (d) top-gate top-contact structure. The OFETs can be fabricated on doped silicon substrates or plastic foils, and the gate dielectric can be composed of inorganic, organic, or hybrid materials as known by those skilled in the art. Gate and source/drain contacts can be made of Au, other metals, or conducting polymers and deposited by vapor-deposition and/or printing.

In one embodiment, the present teachings relate to an organic photovoltaic device (OPV) or organic solar cell, in particular, a bulk heterojunction solar cell. Polymers of the present teachings can exhibit broad optical absorption and/or a tuned redox properties and bulk carrier mobilities, making them desirable for such applications. For example, the bulk heterojunction solar cells can include an anode, a cathode, a photoactive layer in between the anode and the cathode, and one or more interlayers. The photoactive layer can incorporate a blend material (e.g., a blended film) including a polymer of the present teachings as the donor material and an acceptor material. Typical acceptor materials include fullerene-based compounds such as [6,6]-phenyl-$C_{61}$-butyric acid methyl ester (PC61BM) or [6,6]-phenyl-$C_{71}$-butyric acid methyl ester (PC71BM). Other acceptor materials that can be used include n-type small molecule or polymeric semiconductors known in the art.

While the present polymers exhibit good hole-transporting properties which allow them to be used as p-type semiconductors in optoelectronic devices such as organic field-effect transistors (OFET) and organic photovoltaic (OPV) devices, the inventors surprisingly have found that, when used as the hole-transport layer (HTL) in perovskite solar cells (PSC), the present polymers in pristine form (i.e., without doping) can lead to exceptional power conversion efficiencies. More specifically, as described in more details in the Examples below, hybrid organic-inorganic perovskite solar cells using the present polymers alone (i.e., without addition of any chemical dopants) as the hole-transport layer can have power conversion efficiencies (PCE) as high as 14.5%. To the inventor's knowledge, this is the highest PCE ever obtained for dopant-free HTL in PSC, and is comparable to the PCE obtained by the benchmark HTL compound, 2,2',7,7'-tetrakis(N,N-di-p-methoxyphenylamine)-9,9'-spirobifluorene (spiro-OMeTAD) when doped with Li-bis(trifluoromethanesulfonyl)imide (Li-TFSI), which is 15.2% in identical device structures.

Accordingly, an aspect of the present teachings relates to hybrid organic-inorganic perovskite photovoltaic device including a hole-transporting material comprising a polymer described herein. The device generally includes a first electrode, a second electrode, a light-absorbing layer between the first and second electrodes that comprises a perovskite compound and is in contact with the hole-transporting material. An optional blocking layer also can be present, for example, adjacent to either the first electrode or the second electrode.

In some embodiments, the hybrid organic-inorganic perovskite photovoltaic device can have a mesostructured device structure. Specifically, the perovskite absorber can be infiltrated within a mesoporous metal oxide scaffold (which can be an electron-transporting oxide such as $TiO_2$, ZnO, or an insulating layer such as $Al_2O_3$, $ZrO_2$) formed on top of a compact ZnO or $TiO_2$ blocking layer, which itself can be deposited on a transparent conducting oxide substrate (e.g., FTO) that functions as the anode. A hole-transporting material comprising a polymer described herein can be deposited in contact with the perovskite layer. A high work-function metal electrode (e.g., Ag or Au) can be used as the cathode, which is deposited on the hole-transporting material.

In some embodiments, the hybrid organic-inorganic perovskite photovoltaic device can have a planar device structure. In certain embodiments, the planar device can include, from bottom to top, the substrate, a transparent conducting oxide (e.g., FTO) as the anode, an optional electron-transport layer (ETL) comprising an electron-transporting (n-type semiconducting) material, the perovskite layer, a hole-transport layer comprising a hole-transporting (p-type semiconducting) material which includes a polymer described herein, and a metal electrode as the cathode. In such embodiments, a blocking layer composed of a compact $TiO_2$ or ZnO film can be deposited on the anode substrate to improve the morphology of the overlying perovskite. In other embodiments, the planar device can have an inverted structure and can include, from bottom to top, the substrate, a transparent conducting oxide (e.g., FTO) as the cathode, a hole-transport layer comprising a hole-transporting (p-type semiconducting) material which includes a polymer described herein, the perovskite layer, an optional electron-transport layer (ETL) comprising an electron-transporting (n-type semiconducting) material, and a metal electrode as the anode. The ETL, for example, can be composed of one or more fullerene compounds such as PC61BM and PC71BM. A hole-blocking layer (e.g., bathocuproine, BCP) can be included between the ETL and the metal electrode.

The perovskite photovoltaic device, regardless of architecture, can be provided on a substrate which can be a solid, rigid or flexible layer designed to provide robustness. In preferred embodiments, the substrate can be transparent or semi-transparent in the spectral region of interest. As used herein, a material is considered "transparent" when it has transmittance over 50%, and a material is considered "semi-transparent" when it has transmittance between about 50% and about 5%. The substrate can comprise any suitable material known in the art such as glass or a flexible plastic (polymer) film. Examples of suitable plastic substrates include, but are not limited to, polyethylene terephthalate (PET), polyimide, and polyethylene naphthalate (PEN).

The first and second electrodes can be selected from various materials of different work functions. Typically, a transparent first electrode is provided on the substrate, where the transparent electrode is made of a transparent conducting oxide (TCO) such as indium tin oxide (ITO) and fluorine-doped tin oxide (FTO). For example, the first electrode/substrate composite can be selected from FTO-coated glass, ITO-coated glass, ITO-coated PET, and FTO-coated PET. The second electrode typically is a metal electrode selected from gold, silver, and aluminum.

The light-absorbing layer is composed of a perovskite-structured compound; most commonly, a hybrid organic-inorganic lead or tin halide $ABX_3$, where A is an organic cation [typically $CH_3NH_3^+$ (methylammonium or MA) or $HN=CHNH_3^+$ (formamidinium or FA)], B is $Sn^{2+}$ or $Pb^{2+}$, and X is a halide anion that bonds to both. To date, methylammonium lead trihalide ($CH_3NH_3PbX_3$, or $MAPbX_3$ where X is a halogen ion such as $I^-$, $Br^-$, or $Cl^-$) represents the most efficient perovskite material. For example, in the present devices, the light-absorbing layer can comprise the perovskite compound $MAPBI_3$ or $MAPbI_{3-x}Cl_x$, where x is 1 or 2. The light-absorbing layer can have a thickness between about 20 nm and about 800 nm.

The morphology and the crystal structure of the perovskite absorbers can significantly affect the performance of the photovoltaic device. Different deposition methods have been developed in attempt to improve the resulting perovskite structure. The major solution-based deposition methods include one-step precursor deposition, sequential deposition, two-step spin-coating deposition, and spray-coating deposition. In one-step precursor deposition and spray-coating deposition, a precursor solution containing both the metal precursor (e.g., $PbX_2$) and the organic precursor (e.g., MAX) in a solvent such as γ-butyrolacetone (GBL) and N,N-dimethylformamide (DMF) is deposited in one-step, using spin-coating or spray-coating, respectively. In sequential and two-step deposition, a precursor solution containing only the metal precursor (e.g., $PbI_2$) is first deposited, followed by either a dipping step in a solution containing only the organic precursor (e.g., MAI) or a second deposition step using a solution containing only the organic precursor. A thermal annealing step (e.g., at ~100° C.) can be performed to remove the solvent and convert the precursors into crystalline perovskite. Vapor-phase deposition methods also have been used. These include dual source vacuum deposition and sequential vapor deposition. In these deposition processes, instead of depositing the precursors in solution-phase, the metal precursor and the organic precursor are evaporated either simultaneously from separate sources or sequentially layer by layer. In vapor-assisted solution process, the metal precursor solution is first spin-coated onto the substrate. Then, the precursor-coated substrate is annealed in a vapor containing the organic precursor to yield the perovskite film.

The perovskite solar cells according to the present teachings includes a hole-transporting material consisting of a pristine polymer, specifically, a copolymer including a benzo[1,2-d;4,5-d']bistriazole-containing repeating unit and a benzo[1,2-b:4,5-b']dithiophene-containing repeating unit. The hole-transporting material is free of any dopants typically used with spiro-OMeTAD, the state-of-the-art HTM compound, such as 4-tert-butylpyridine (TBP), bis(trifluoromethane)sulfonimide lithium salt (Li-TFSI), and tris(2-(1H-pyrazol-1-yl)4-tert-butylpyridine)cobalt(III) tris(bis(trifluoromethylsulfonyl)imide) (FK209). Compared to spiro-OMeTAD, the present polymers can be synthesized via straightforward synthetic routes, hence lowering production costs. In addition, the elimination of dopants can improve device stability and simplify the overall device fabrication process.

In various embodiments, the pervoskite photovoltaic device can include one or more optional interface layers ("interlayers") between the anode and the light-absorbing layer and/or between the cathode and the light-absorbing layer. For example, in some embodiments, an optional smoothing layer (e.g., a film of 3,4-polyethylenedioxythiophene (PEDOT), or 3,4-polyethylenedioxythiophene:polystyrene-sulfonate (PEDOT:PSS)) can be present between an electrode and the light-absorbing layer. The optional interlayer(s) can perform other functions such as reducing the energy barrier between the light-absorbing layer and the electrode, forming selective contacts for a single type of carrier (e.g., a hole-blocking layer), modifying the work function of the adjacent electrode, and/or protecting the underlying light-absorbing layer. In some embodiments, a transition metal oxide layer such as $V_2O_5$, $MoO_3$, $WO_3$ and NiO can be used as the p-type buffer. To improve device stability, an n-type buffer composed of LiF, CsF or similar fluorides can be provided. Depending on the composition, the interlayers can be solution-processed (e.g., sol-gel deposition, self-assembled monolayers) or deposited by vacuum processes such as thermal evaporation or sputtering.

The following examples are provided to illustrate further and to facilitate the understanding of the present teachings and are not in any way intended to limit the invention. All the chemicals were purchased from Sigma Aldrich except for the following: anhydrous ethanol (Acros Organics), TAB.4HBr (Hangzhou Trylead Chemical Technology Co. Ltd.), $Pd[PPh_3]_2Cl_2$ (Strem Chemicals Inc.).

$^1$H and $^{13}$C data were performed on Bruker Avance III 500 MHz system with chemical shifts referenced to CDCl$_3$ respectively. Matrix assisted laser desorption/ionization time-of-flight (MALDI-TOF) mass spectra were obtained on a Bruker Autoflex III Mass Spectrometer. Elemental analysis was carried out by Midwest Microlab, LLC. Cyclic voltammetry experiments were performed using BASi C-3 Cell Stand. All thin film CV measurements of the synthesized polymers on platinum were recorded in dry acetonitrile with 0.1 M tetrabutylammonium hexafluorophosphate as supporting electrolyte (scan rate of 100 mV·s$^{-1}$). The experiments were performed at room temperature with a conventional three electrodes configuration consisting of a platinum working electrode, a platinum wire counter electrode, and an Ag/AgCl in 3 M NaCl reference electrode. DFT geometry optimization of the (Th$_2$-BBT26)-BDT-(Th$_2$-BBT26) was carried out in the gas phase using RB3LYP and broken-symmetry UB3LYP 6-31$^{++}$ (d,p).

EXAMPLE 1

Synthesis of 4,8-Dithien-2-yl-Benzo[1,2-d;4,5-d'] bistriazole-alt-Benzo[1,2-b:4,5-b']dithiophene Copolymers

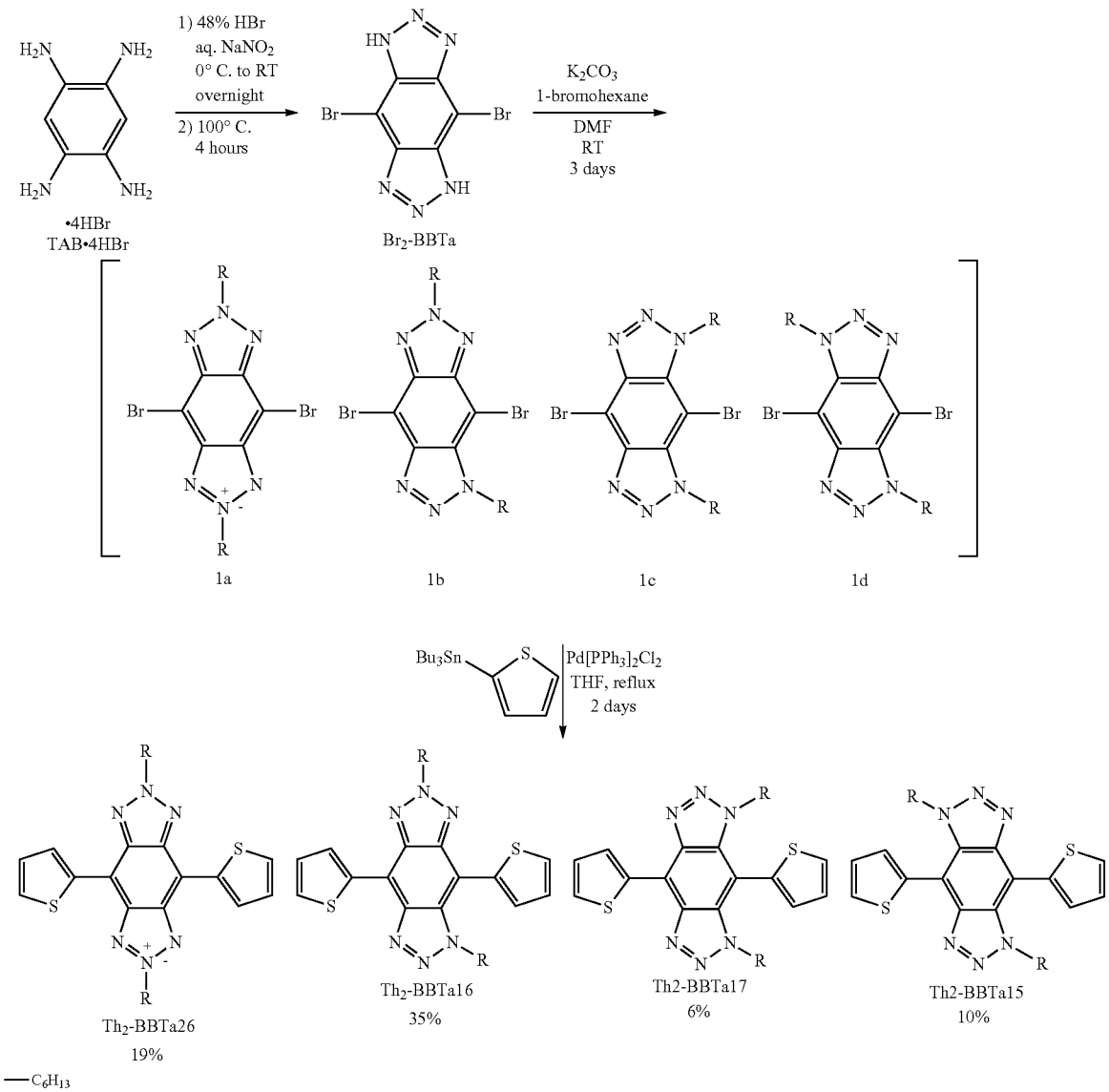

Synthesis of Th$_2$-BBT isomers. Referring to Scheme 1, tetraaminobenzene tetrahydrobromide (TAB.4HBr, 21 g, 45.5 mmol) was added to 48% aqueous HBr (300 mL) and allowed to cool down to 0° C. Sodium nitrite (NaNO$_3$, 31.38 g, 454.7 mmol) was dissolved in deionized water (500 mL) and was added dropwise to the reaction mixture using an additional funnel in air. Brown gas evolved upon addition of the NaNO$_3$ solution. After addition of the NaNO$_3$ solution, the reaction was allowed to warm up to room temperature overnight. The reaction mixture was heated to 100° C. for 4 hours and then cooled down to room temperature. The resulting precipitate of the dibromo-BBT (Br$_2$-BBT) was then filtered, washed excessively with deionized water and dried. The crude Br$_2$-BBT was used for the next step without further purification. Specifically, the crude Br$_2$-BBT was added to DMF (90 mL) together with anhydrous K$_2$CO$_3$ (15.06 g, 109.0 mmol), 1-bromohexane (14.04 mL, 100.0 mmol) and the reaction mixture was allowed to stir at room temperature for 3 days under a nitrogen environment. The reaction mixture was added to 500 mL of water and extracted using dichloromethane. The organic layer was collected, dried over anhydrous MgSO$_4$, and stripped from all volatiles. The residue was forced through a short silica column using dichloromethane as the eluent to yield the crude isomers. These crude isomers were used directly without purification in the subsequent Stille coupling reaction with 2-(tributylstannyl)thiophene. Specifically, under a nitrogen environment, the stannylated thiophene (28.9 mL, 91.0 mmol) was added with the crude mixture to THF (200 mL) and the reaction was heated under reflux for 2 days. The reaction mixture was cooled to room temperature and most of the volatiles were removed under vacuum. The residue was dry loaded into a silica column with hexane as the eluent to separate the resulting Stille coupled isomers, giving an overall yield of ~70%. The isomer Th$_2$-BBT26 was obtained at a yield of 19% (4.2 g) as red crystalline solids.

Th$_2$-BBT26. $^1$H NMR (CDCl$_3$): δ, [ppm] 0.90 (t, 6H, J=7.3 Hz), 1.26-1.52 (m, 4H), 2.30 (quintet, 4H, J=7.4 Hz), 4.94 (t, 4H, J=7.3 Hz), 7.29 (dd, 2H, J=4.0, 5.0 Hz), 7.55 (dd, 2H, J=1.0, 5.0 Hz), 8.72 (dd, 2H, J=1.0, 5.0 Hz). $^{13}$C NMR (CDCl$_3$): δ, [ppm] 14.0, 22.5, 26.3, 30.0, 31.21, 31.22, 57.8, 109.8, 127.7, 127.9, 129.5, 137.1, 141.2. Anal. Calcd for C$_{26}$H$_{32}$N$_6$S$_2$: C, 63.38; H, 6.55; N, 17.06; S, 13.02. Found: C, 63.68; H, 6.71; N, 16.88. MALDI-TOF-MS m/z: 492.23 (M$^+$); calcd. for C$_{26}$H$_{32}$N$_6$S$_2$=492.70.

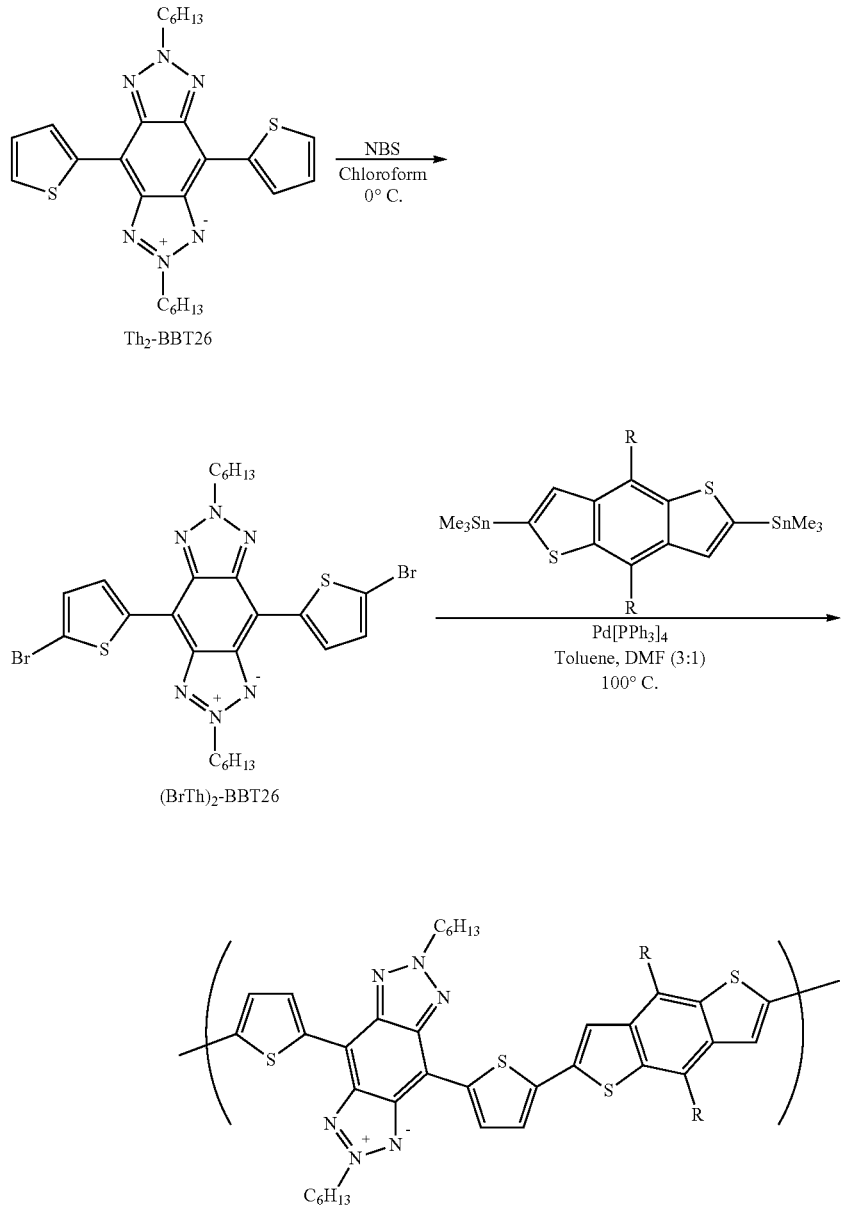

Scheme 2

-continued

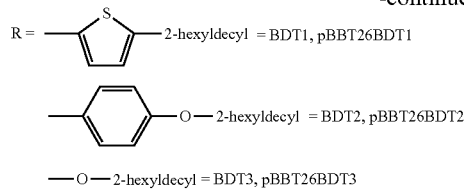

Synthesis of Th$_2$-BBT based polymers. The 2,6-dialkylated isomer Th$_2$-BBT26 (1.00 g, 2.03 mmol) was dissolved in chloroform and placed in an ice bath. To the solution was added dropwise NBS (0.722 g, 4.06 mmol) dissolved in chloroform (200 mL). After addition of NBS, the reaction was allowed to warm up to room temperature overnight. The reaction was quenched using aqueous sodium thiosulfate (Na$_2$S$_2$O$_3$) and the organic layer was collected, dried over anhydrous MgSO$_4$ and filtered. The solvent was removed using a rotary evaporator and the resulting residue was purified using column chromatography (100% hexane to 80% hexane 20% dichloromethane) to yield the dibromo compounds (Br—Th)$_2$-BBT26 as maroon crystals (1.201 g, 91% yield).

(BrTh)$_2$-BBT26. $^1$H-NMR (500 MHz, chloroform-d): δ 0.91 (t, J=7.2 Hz, 6H), 1.52-1.30 (m, 13H), 2.27 (p, J=7.3 Hz, 4H), 4.90 (t, J=7.2 Hz, 4H), 7.22 (d, J=4.0 Hz, 2H), 8.44 (d, J=4.0 Hz, 2H). $^{13}$C-NMR (125 MHz, chloroform-d) δ 140.99, 138.82, 130.76, 129.89, 116.05, 109.24, 58.00, 31.35, 30.16, 26.46, 22.66, 14.18. Anal. calcd for C$_{26}$H$_{30}$Br$_2$N$_6$S$_2$: C, 48.01; H, 4.65; N, 12.92. Found: C, 48.39; H, 4.80; N, 12.87. MALDI-TOF-MS m/z: 649.96 (M$^+$); calcd for C$_{26}$H$_{30}$Br$_2$N$_6$S$_2$=650.49.

The dibromo compound was reacted with distannylated benzo[1,2-b:4,5-b']dithiophenes (BDTs) to give Th$_2$-BBT-co-BDT polymers. Specifically, to (BrTh)$_2$-BBT26 (128 mg, 0.20 mmol) and 1 equivalence of the distannyl BDT monomer (0.20 mmol) was added Pd(PPh$_3$)$_4$ (9 mg, 4 mol %) in a round-bottom flask purged with nitrogen. Next, 20 mL of dry toluene and 7 mL of dry DMF were injected into the flask and the reaction was stirred at 100° C. for 1 day. The reaction mixture was allowed to cool to room temperature and was poured into 200 mL of methanol. The mixture was stirred for 3 h at room temperature and then filtered. The resulting crude polymer was purified using Soxhlet extraction with acetone, hexanes and finally, chloroform.

pBBT26BDT2: Blue solids (90% yield). Anal. Calcd. for (C$_{80}$H$_{108}$N$_6$O$_2$S$_6$)$_n$: C, 73.12; H, 8.28; N, 6.40; 0, 2.44; S, 9.76. Found: C, 73.45; H, 8.34; N, 6.49. GPC in trichlorobenzene, 150° C.: Mw: 118977, PDI: 2.13.

pBBT26BDT3: Blue solids (91% yield). Anal. Calcd. for (C$_{68}$H$_{100}$N$_6$O$_2$S$_4$)$_n$: C, 70.30; H, 8.68; N, 7.23; O, 2.75; S, 11.04. Found: C, 70.39; H, 8.74; N, 7.22. GPC in trichlorobenzene, 150° C.: M$_w$: 124915, PDI: 1.96.

EXAMPLE 2

Polymer Characterization

The three Th$_2$-BBT-co-BDT polymers from Example 1 were characterized via UV-Vis-NIR spectroscopy, X-ray diffraction studies, and cyclic voltammetry experiments. Relevant chemical and physical data are reported in Table 1.

Figure 2A:
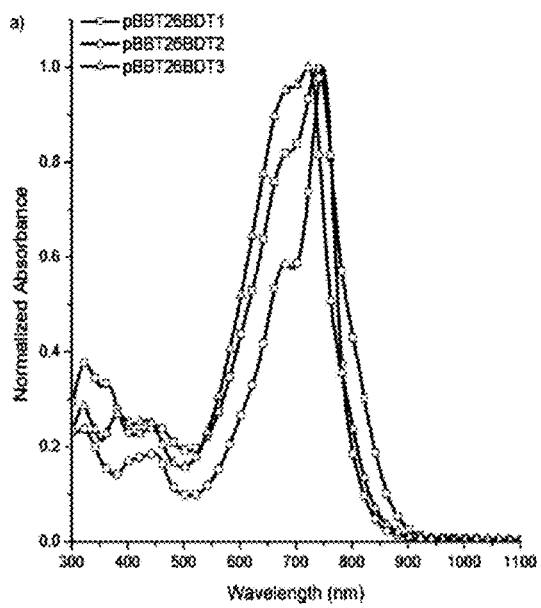
FIGS. 2A-B compare the UV-Vis-NIR absorption spectra of the three exemplary polymers (A) in solution and (B) in thin film forms.
Figure 2B:
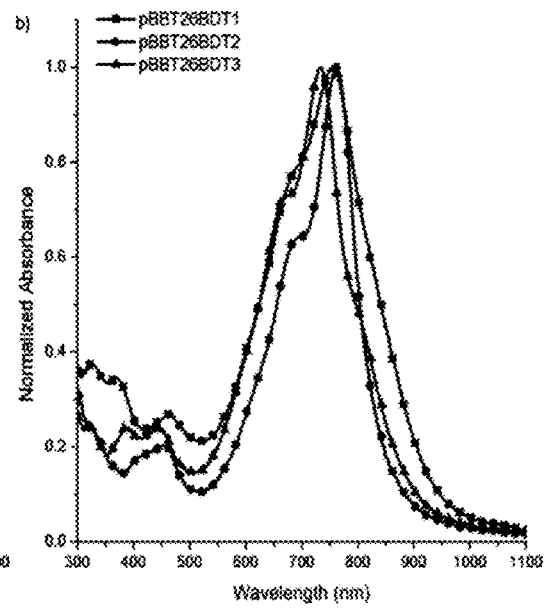

Specifically, the optical absorption spectra of the Th$_2$-BBT-co-BDT polymers were recorded both in chloroform and as spin-coated films (FIG. 2). All three polymers exhibit rather low bandgaps, with values of ~1.3 eV in thin films and ~1.4 eV in solution.

Figure 3:
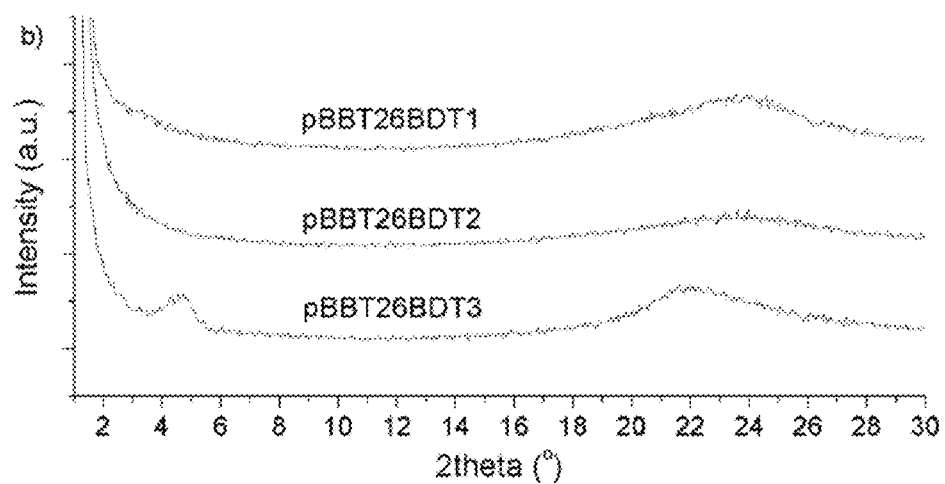
FIG. 3 compares the X-ray diffraction patterns of the three exemplary polymers.

Thin film X-ray diffraction (XRD) studies showed that the Th$_2$-BBT-co-BDT polymers are largely amorphous due to the lack of strong diffraction peaks (FIG. 3).

Figure 4:
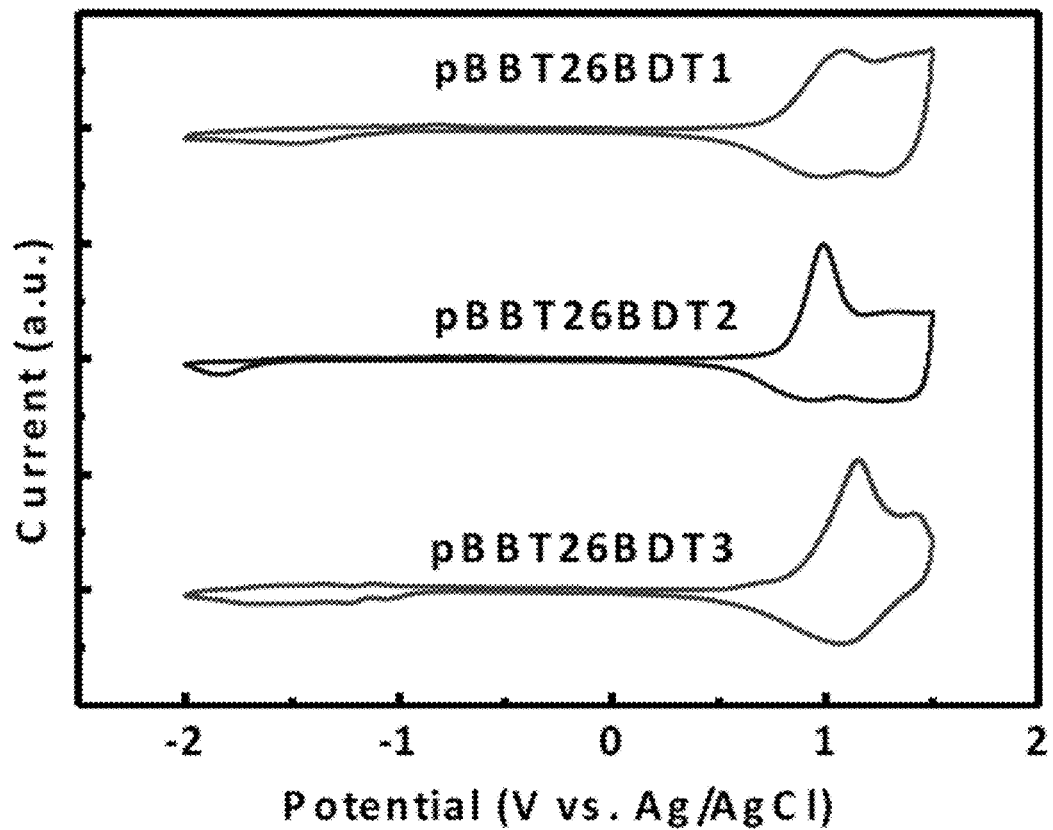
FIG. 4 compares thin film cyclic voltammetry measurements of the three exemplary polymers.

Cyclic voltammetry (CV) experiments were carried out to probe electrochemical processes and quantify the frontier molecular orbital (FMO) energies. All polymers exhibit quasi-reversible oxidations without obvious reduction features (FIG. 4). From the oxidation onsets, located at +0.74, +0.71 and +0.81 V for pBBT26BDT1, pBBT26BDT2 and pBBT26BDT3, respectively, the HOMO energy levels were estimated versus the HOMO of ferrocene as the reference (4.8 eV, +0.40 V vs. Ag/AgCl). Accordingly, the HOMO values derived from the CV measurements are −5.14, −5.11 and 5.21 eV respectively. The LUMO values were estimated using the thin film optical bandgaps, and found to be −3.82, −3.72 and −3.84 eV respectively.

TABLE 1

| | HOMO[a] (eV) | LUMO[b] (eV) | Solution Optical Bandgap E$_g$ (eV) | Solution UV[c] λ$_{max}$ (nm) | Film Optical Bandgap E$_g$ (eV) | Film UV λ$_{max}$ (nm) | M$_w$[d] (g mol$^{-1}$) | PDI |
|---|---|---|---|---|---|---|---|---|
| pBBT26BDT1 | −5.14 | −3.82 | 1.42 | 740 | 1.32 | 756 | 40121 | 2.25 |
| pBBT26BDT2 | −5.11 | −3.72 | 1.48 | 748 | 1.39 | 760 | 118977 | 2.13 |
| pBBT26BDT3 | −5.21 | −3.84 | 1.47 | 722 | 1.37 | 734 | 124915 | 1.96 |

[a]HOMO values were determined by thin film CV.
[b]LUMO values were obtained by addition of thin film optical bandgaps to HOMO.
[c]Solution UV-Vis-NIR absorbance were measured in chloroform.
[d]Polymer molecular weight was determined by GPC in 1,2,4-trichlorobenzene against polystyrene standard

EXAMPLE 3

OFET and OPV Device Fabrication

Bottom-gate top-contact organic field-effect transistor (OFET) devices were fabricated on n-octadecyltrichlorosilane (OTS) treated Si/SiO$_2$ substrates using the Th$_2$-BBTco-BDT polymers as the active semiconductor layer. Specifically, the 300 nm Si/SiO$_2$ substrates were cleaned first in an ultrasonic bath of isopropyl alcohol followed by O$_2$ plasma treatment. The substrates were then immersed in the OTS-hexane solution for an hour and subsequently sonicated with hexane and dried by N$_2$ flow. The polymer solutions in chlorobenzene (20 mg/ml) were spin-coated on the substrates. The gold source and drain electrodes (40 nm) were vapor-evaporated at 1×10$^{-6}$ Torr through a shadow mask. Devices were fabricated with typical channel lengths and channel width of 50 µm and 1000 µm, respectively. The characterization was performed under ambient conditions on a custom probe station with an Agilent 1500 semiconductor parameter analyzer. The charge carrier mobility µ was evaluated in the saturation region with by the following equation:

$$I_{DS}=(WC_i/2L)/\mu(V_{GS}-V_T)^2$$

where $C_i$ is the capacitance per unit area of insulator, $V_T$ is the threshold voltage, and $V_{GS}$ is gate voltage, W and L are channel width and length respectively.

Figures 5A, 5B, 5C:
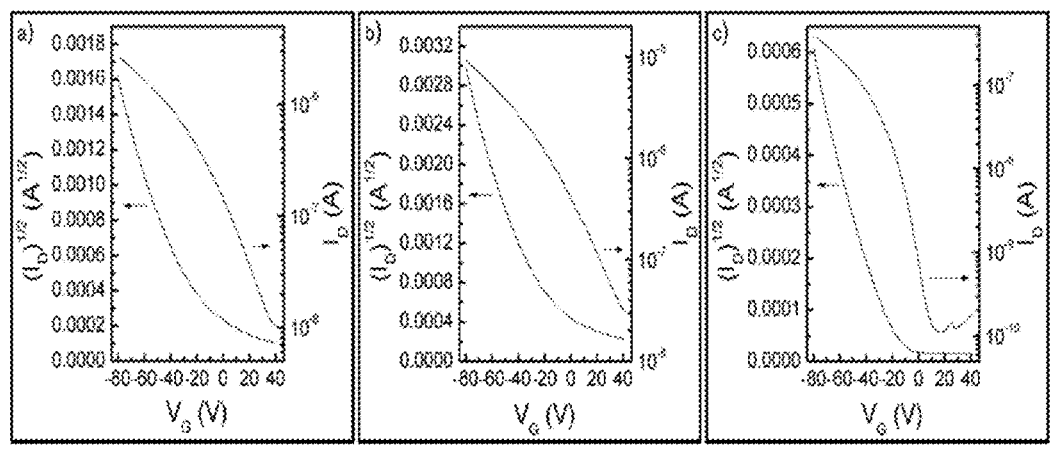
FIGS. 5A-C show the $I_D$-$V_G$ transfer plots of organic field-effect transistor devices incorporating a polymer according to the present teachings as the active channel layer: A) pBBT26BDT1, B) pBBT26BDT2 and C) pBBT26BDT3.

FIG. 5 provides the $I_D$-$V_G$ transfer plots of sample OFET devices. The Th$_2$.BBT-co-BDT polymers displayed average hole mobilities ($\mu_{hole}$) in the order of 10$^{-2}$-10$^{-3}$ V·cm$^{-1}$s$^{-1}$ with on/off ratio in the order of 10$^2$-10$^4$. No n-type mobility was observed.

Figure 6A:
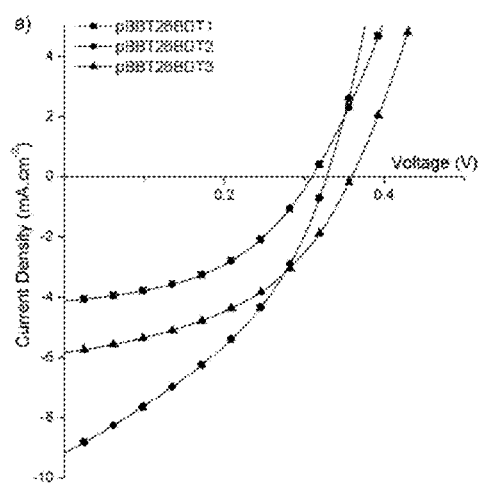
FIGS. 6A-B show (A) the current density-voltage (J-V) curves and (B) the external quantum efficiency (EQE) spectra of organic bulk-heterojunction photovoltaic devices having a blend photoactive layer that includes a polymer according to the present teachings as the donor material and PC71BM as the acceptor material.
Figure 6B:
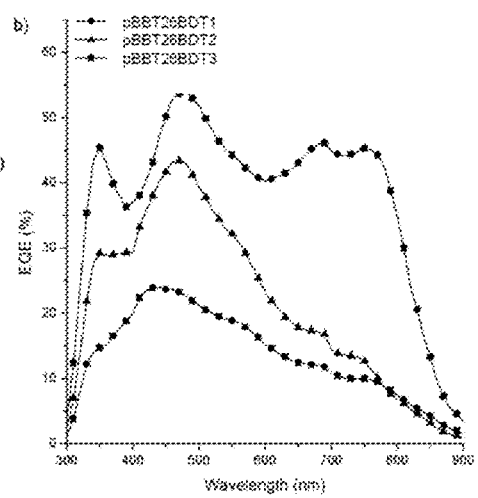

Bulk heterojunction OPV devices were fabricated using the Th$_2$-BBT-co-BDT polymers as the donor material in a blend with PC71BM as the acceptor material. The conventional geometry (ITO/PEDOT:PSS/Polymer:PC71BM(1: 1.5)/LiF/Al) was used. FIG. 6 provides the current density-voltage (J-V) curves and EQE spectra of sample OPV devices.

Table 2 summarizes the key device parameters for the OFET and OPV devices.

TABLE 2

| | $\mu_{hole}$ (V·cm$^{-1}$s$^{-1}$)* | on/off ratio | $J_{sc}$ (mA/cm$^2$) | $V_{oc}$ (V) | FF | PCE (%)* |
|---|---|---|---|---|---|---|
| pBBT26BDT1 | 0.02 (0.0089) | >10$^3$ | 4.12 | 0.31 | 0.46 | 0.58 (0.50) |
| pBBT26BDT2 | 0.045 (0.026) | >10$^2$ | 9.16 | 0.33 | 0.37 | 1.12 (1.02) |
| pBBT26BDT3 | 0.0034 (0.0017) | >10$^3$ | 5.84 | 0.36 | 0.45 | 0.94 (0.85) |

*Average values are shown in parentheses.

EXAMPLE 4

Th$_2$ BBT-Co-BDT Polymers as HTL in Perovskite Solar Cells

Figure 7:
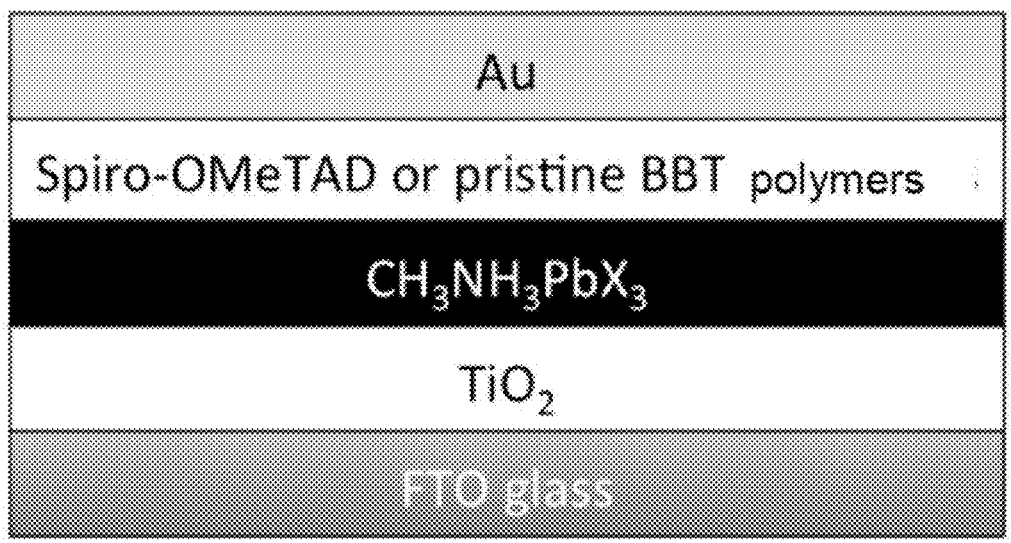
FIG. 7 shows the device architecture used to investigate the present polymers as hole-transporting materials in perovskite solar cells.

Perovskite solar cells (PSCs) using the present polymers in pristine form (without dopants) as hole-transport layer (HTL) were fabricated. A simplified PHJSC architecture was used with the device geometry being FTO/TiO$_2$/CH$_3$NH$_3$PbCl$_{3-x}$I$_x$/HTL/Au (FIG. 7). The mixed-halide perovskite absorber of ~300 nm was prepared on planar TiO$_2$/FTO substrates. Control devices were fabricated with 2,2', 7,7'-tetrakis-(N,N-di-4-methoxyphenylamino)-9,9'-spirobifluorene (spiro-OMeTAD) as the HTL with and without the dopant lithium-bis(trifluoromethanesulfonyl) imide (Li-TFSI).

Specifically, fluorine-doped tin oxide (FTO) glass substrates were ultrasonically cleaned in detergent, methanol, isopropanol sequentially followed by plasma treatment for 15 minutes. For the preparation of TiO$_2$ sol-gel solution, a 0.013 HCl solution (2.53 mL of anhydrous ethanol and 35 µL of 2 M HCl) was added drop-wise under vigorous stirring into titanium isopropoxide solution (375 uL titanium tetraisopropoxide in 2.53 mL anhydrous ethanol). A 50 nm TiO$_2$ compact layer was deposited on FTO substrates by spin coating the sol-gel solution at 1000 rpm for 40 s. After spin coating, the substrates were sintered at 500° C. for 30 minutes. The perovskite solution was prepared by dissolving lead chloride and methylammonium iodide (molar ratio=1: 3, concentration=40 wt %) in anhydrous N,N-dimethylformamide and being stirred at room temperature for 20 minutes. The FTO/TiO$_2$ substrates were transferred into a humidity box with relative humidity around 3% for spin coating the perovskite layer at 2000 rpm for 40 s. Subsequently, the as-casted perovskite layer was thermal annealed at 100° C. for 1 hour for crystallization. The spin-coating of hole transporting materials was performed at 2000 rpm for 40 s in glove box using polymer solution in chlorobenzene (10 mg/mL). For the control device, the spiro-OMeTAD solution (80 mg spiro-OMeTAD, 28.5 ml 4-tertbutylpyridine and 17.5 ml lithium-bis(trifluoromethanesulfonyl)imide solution (520 mg/ml in acetonitrile) all dissolved in 1 ml chlorobenzene) was spin-coated at 4,000 r.p.m. for 30 s. The devices were completed by thermal evaporating 100 nm gold electrode with an active area of 0.09 cm$^2$.

The solar cell devices were tested in air with shadow mask of 0.12 cm$^2$ under A.M. 1.5 radiation (100 mW/cm$^2$) using a solar simulator source (Newport Inc.) and Keithley 2400 source meter. The EQE spectrum was characterized by an Oriel model QE-PV-SI instrument equipped with a NIST-certified Si diode. Molar UV-Vis absorption spectra were recorded on a Lambda 900 Spectrometer from Perkin Elmer. Polymer UV-Vis-NIR absorption spectra were recorded on a Perkin Elmer LAMBDA 1050, with a 150 mm integrating sphere for thin film measurements. The cross-sectional TEM sample was prepared by standard focused ion beam (FIB) milling and lift off processes using an FEI Helios Nanolab Dual Beam scanning electron and focused ion beam microscope. Briefly, the sample was cut from the gold electrode all the way to the FTO glass, and was subsequently mounted on a copper-made FIB lift-out TEM grid. Prior to the ion milling the sample was protected by a 2 micron thick platinum layer. The samples were gradually thinned down to below 100 nm and then observed under a JEOL JEM 2100F field emission transmission electron microscope at 200 kV with a Gatan CCD camera. Bright field images were acquired under the TEM mode, and both annular dark field images and energy-dispersive X-ray spectroscopy (EDS) were acquired under the STEM mode.

Figure 8:
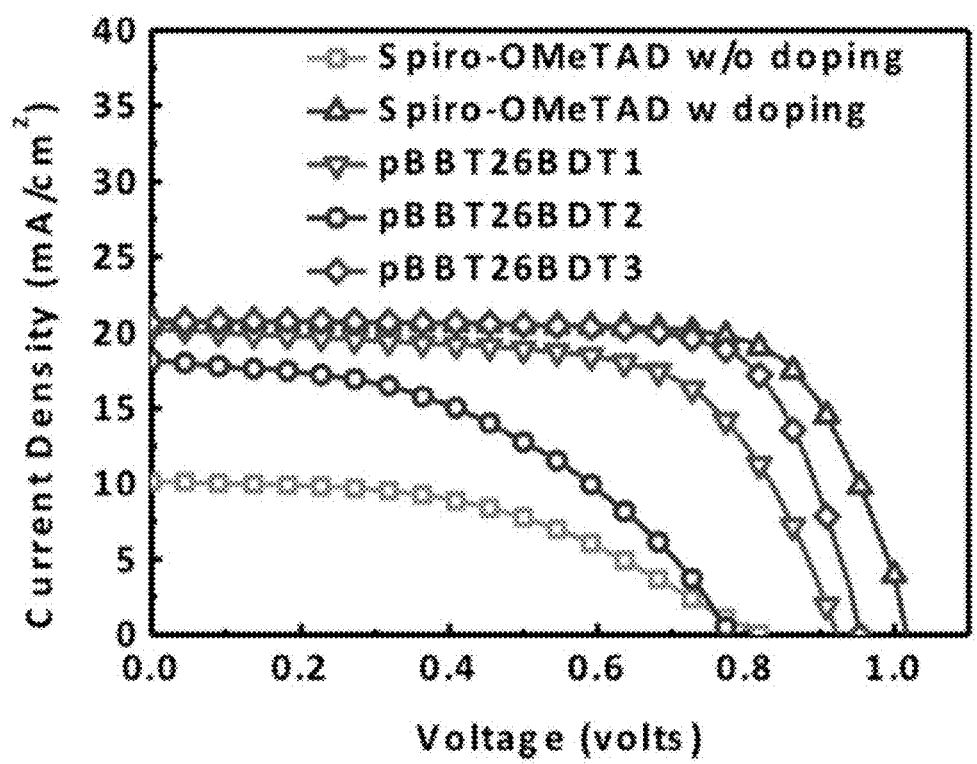
FIG. 8 compares the current density-voltage (J-V) curves of perovskite photovoltaic devices having a hole-transport layer composed of (i) doped spiro-OMeTAD, (ii) undoped spiro-OMeTAD, (iii) pBBT26BDT1, (iv) pBBT26BDT2 and (v) pBBT26BDT3.

The current density-voltage (J-V) curves of the solar cell devices measured under standard A.M. 1.5 solar spectrum are shown in FIG. 8. Their photovoltaic characteristics are summarized in Table 3. The statistics of average values and standard deviations were obtained from 20 devices made from at least 7 independently prepared pieces.

TABLE 3

| HTM in PSC devices | $V_{oc}$ (V) | $J_{sc}$ (mA/cm$^2$) | FF | PCE* (%) |
|---|---|---|---|---|
| Spiro-OMeTAD w/o doping | 0.82 | 10.1 | 0.47 | 3.9 (2.26 ± 0.86) |
| Spiro-OMeTAD w/ doping | 1.02 | 20.2 | 0.74 | 15.2 (13.96 ± 0.87) |
| pBBT26BDT1 | 0.92 | 20.0 | 0.66 | 12.1 (11.07 ± 1.22) |
| pBBT26BDT2 | 0.77 | 18.1 | 0.50 | 7.0 (5.05 ± 1.26) |
| pBBT26BDT3 | 0.95 | 20.3 | 0.75 | 14.5 (12.57 ± 1.12) |

*Average values are shown in parentheses.

It can be seen that PSC devices having HTL composed of intrinsic spiro-OMeTAD without dopants have poor power conversion efficiencies (3.9% without dopant versus 15.2% for Li-TFSI-doped spiro-OMeTAD). The addition of dopant, therefore, is critical for improving the mobility/conductivity of spiro-OMeTAD.

The present polymers, on the other hand, achieved PCEs (14.5%) comparable to that of spiro-OMeTAD without the use of dopants/additives, with correspondingly similar short circuit current density ($J_{sc}$) ~20 mA/cm², fill factor (FF) ~0.75, and slightly lower open circuit voltage ($V_{oc}$) values 0.95 V (c.f. 1.0 V for doped spiro-OMeTAD). The results show that the present semiconducting polymers intrinsically can collect holes efficiently from the perovskite layer and transport them toward the metal electrode without the assistance of chemical dopants.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A hybrid organic-inorganic perovskite photovoltaic device comprising a first electrode, a second electrode, a light-absorbing layer between the first and second electrodes that comprises a perovskite compound, and a hole-transporting material in contact with the perovskite compound, wherein the hole-transporting material comprises a copolymer comprising a benzo[1,2-d:4,5-d']bistriazole-containing repeating unit and a benzo[1,2-b:4,5-b']dithiophene-containing repeating unit.

2. The device of claim 1, wherein the copolymer comprises a repeating unit represented by formula (I):

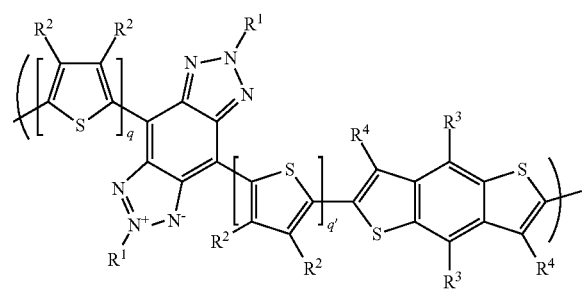

wherein:
R¹, at each occurrence, independently is a solubilizing group;
R², at each occurrence, independently is selected from the group consisting of H, F, Cl, CN, and a $C_{1-40}$ alkyl or haloalkyl group;
R³ and R⁴, at each occurrence, independently are selected from the group consisting of H, F, Cl, and -L-(Ar)$_m$-L'-R⁵, wherein L and L', independently are selected from the group consisting of —O—, —S—, —Se—, —C(O)—, —OC(O)—, —C(O)O—, a divalent $C_{1-40}$ alkyl or haloalkyl group, and a covalent bond; R⁵ is a solubilizing group; Ar, at each occurrence, independently is a $C_{6-14}$ aryl group or a 5-14 membered heteroaryl group, each of which optionally is substituted with 1-4 -L'-R⁵ groups; and m is 0, 1, 2, 3 or 4; and
q and q' independently are 0, 1, 2, 3 or 4.

3. The device of claim 2, wherein each of the solubilizing group independently is selected from the group consisting of a $C_{3-40}$ alkyl group, a $C_{3-40}$ alkenyl group, and a $C_{3-40}$ haloalkyl group.

4. The device of claim 2, wherein the copolymer comprises a repeating unit represented by formula (II):

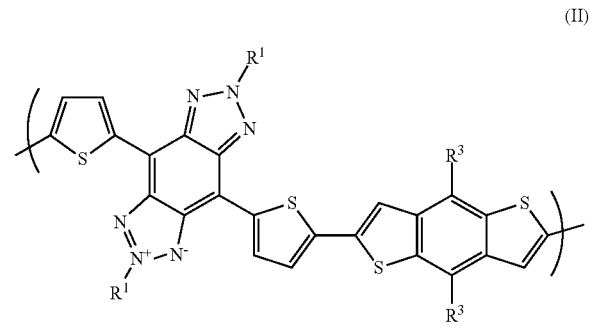

wherein each R¹ is a $C_{3-40}$ alkyl group.

5. The device of claim 4, wherein each R³ is an —O—$C_{3-40}$ alkyl group.

6. The device of claim 4, wherein each R³ is a $C_{3-40}$ alkyl group.

7. The device of claim 4, wherein each R³ is —(Ar)-L'-R⁵, wherein Ar is a thienyl or phenyl group, L' is O or a covalent bond; and R⁵ is a $C_{3-40}$ alkyl group.

8. The device of claim 7, wherein each R³ is a -phenyl-O—$C_{3-40}$ alkyl group.

9. The device of claim 7, wherein each R³ is a -thienyl-$C_{3-40}$ alkyl group.

10. The device of claim 1, wherein the hole-transporting material is free of any dopants.

11. The device of claim 1, wherein the hole-transporting material is free of a dopant selected from the group consisting of 4-tert-butylpyridine (TBP), bis(trifluoromethane)sulfonimide lithium salt (Li-TFSI), and tris(2-(1H-pyrazol-1-yl)4-tert-butylpyridine)cobalt(III) tris(bis(trifluoromethylsulfonyl)imide) (FK209).

12. The device of claim 1, wherein the perovskite compound has the formula ABX₃, wherein A is $CH_3NH_3^+$ or $HN=CHNH_3^+$, B is $Sn_2^+$ or $Pb_2^+$, and each X independently is selected from I⁻, Br⁻, and Cl⁻.

13. The device of claim 12, wherein the perovskite compound is $CH_3NH_3PbI_3$ or $CH_3NH_3PbI_{3-x}Cl_x$, where x is 1 or 2.

14. The device of claim 1 having a planar structure, wherein the light-absorbing layer is a thin film comprising the perovskite compound.

15. The device of claim 14 further comprising a blocking layer between one of the first and second electrodes and the light-absorbing layer.

16. The device of claim 15, wherein the blocking layer comprises $TiO_2$ or ZnO.

17. The device of claim 14 comprising a transparent conducting oxide as the first electrode, wherein the transparent conducting oxide is fluorine-doped tin oxide (FTO).

18. The device of claim 14 comprising a metal as the second electrode, wherein the metal is Au or Ag.

* * * * *